United States Patent [19]

Watanabe

[11] Patent Number: 4,676,602
[45] Date of Patent: Jun. 30, 1987

[54] DRIVING CIRCUIT FOR LIQUID CRYSTAL DISPLAY

[75] Inventor: Shizuhisa Watanabe, Katsuta, Japan

[73] Assignee: Hitachi, Ltd., Tokyo, Japan

[21] Appl. No.: 742,784

[22] Filed: Jun. 10, 1985

[30] Foreign Application Priority Data

Jun. 13, 1984 [JP] Japan ................. 59-119904

[51] Int. Cl.⁴ .............................................. G02F 1/13
[52] U.S. Cl. .................................... 350/332; 350/333
[58] Field of Search .................. 350/332, 333, 331 R, 350/331 T; 340/789, 805

[56] References Cited
U.S. PATENT DOCUMENTS 4,508,429 4/1985 Nagae et al. .................. 350/332

Primary Examiner—Arthur G. Evans
Attorney, Agent, or Firm—Antonelli, Terry and Wands

[57] ABSTRACT

In a circuit for driving a liquid crystal display element, during a latter half part of an indication renewal period a common electrode is supplied with lower maximum and higher minimum voltages than the maximum and minimum voltages supplied during a first half part of the indication renewal period, in order to enhance response speed of the liquid crystal display element.

6 Claims, 12 Drawing Figures

DRIVING CIRCUIT FOR LIQUID CRYSTAL DISPLAY

BACKGROUND OF THE INVENTION

The present invention relates to a driving circuit for a liquid crystal display which is appropriate to meters of a car and provides sufficient response characteristics even at low temperature.

Recently a liquid crystal display has been in use widely for meters of a car for the reason that it is easy to see in such a light place as under direct sunshine and that it requires less volume due to the possibility of equipping in a flat panel and that it is appropriate to many kinds of display due to the possibility of colored display.

However, there is a problem such that the improvement of the response speed is necessary because the response speed of a liquid crystal display is comparatively slow, particularly at low temperature, due to the characteristics of the material of liquid crystal. Therefore, many methods for the improvement have been proposed up to this time. For example, the method for the improvement of the response speed by the proper design of the driving circuit was proposed in IEEE TRANSACTION ON INDUSTRIAL ELECTRONICS VOL. IE-30. NO. 2 (MAY 1983) P. 138-142.

However, this method can not be applied to conventionally used driving circuits due to the necessity of either driving each segment directly by a microcomputer or manufacturing a special I.C. for driving because the improvement of the response speed is attained by controlling the phase of the driving signal for each segment of a liquid crystal display element. Consequently, this method has a disadvantage that the realization is expensive.

SUMMARY OF THE INVENTION

The object of the present invention is to overcome the disadvantage of the conventional technology described above by improving the response speed of a liquid crystal display and is applicable to the conventionally used driving circuit.

The above object is accomplished according to the present invention by providing a driving circuit which comprises first means for generating a first driving wave which has a periodic alternation of maximum and minimum voltages with a predetermined repetition period, second means for generating a second driving wave which has a periodic alternation of maximum and minimum voltages with the same repetition period as the first driving wave, the maximum voltage of the second driving wave being lower than that of the first driving wave and the minimum voltage of the second driving wave being higher than that of the first driving wave, and third means for applying the first driving wave to the common electrode during the initial stage of the indication renewal period and applying the second driving wave to the common electrode during the remaining stage of the indication renewal period.

BRIEF DESCRIPTION OF THE DRAWINGS

FIG. 2A shows ON and OFF timings of a segment of a liquid crystal display element, FIG. 2B is a waveform of a signal M, FIG. 2C is a waveform of a signal CONT, FIG. 2D is a waveform of a signal applied to a common electrode of the liquid crystal display element, FIG. 2E is a waveform of a signal applied to a segment electrode of the liquid crystal display element, FIG. 2F is a waveform of a voltage between the segment electrode and the common electrode of the liquid crystal display element, and FIG. 2G shows an effective value of the voltage shown in FIG. 2F.

DETAILED DESCRIPTION OF PREFERRED EMBODIMENTS

Figure 1:
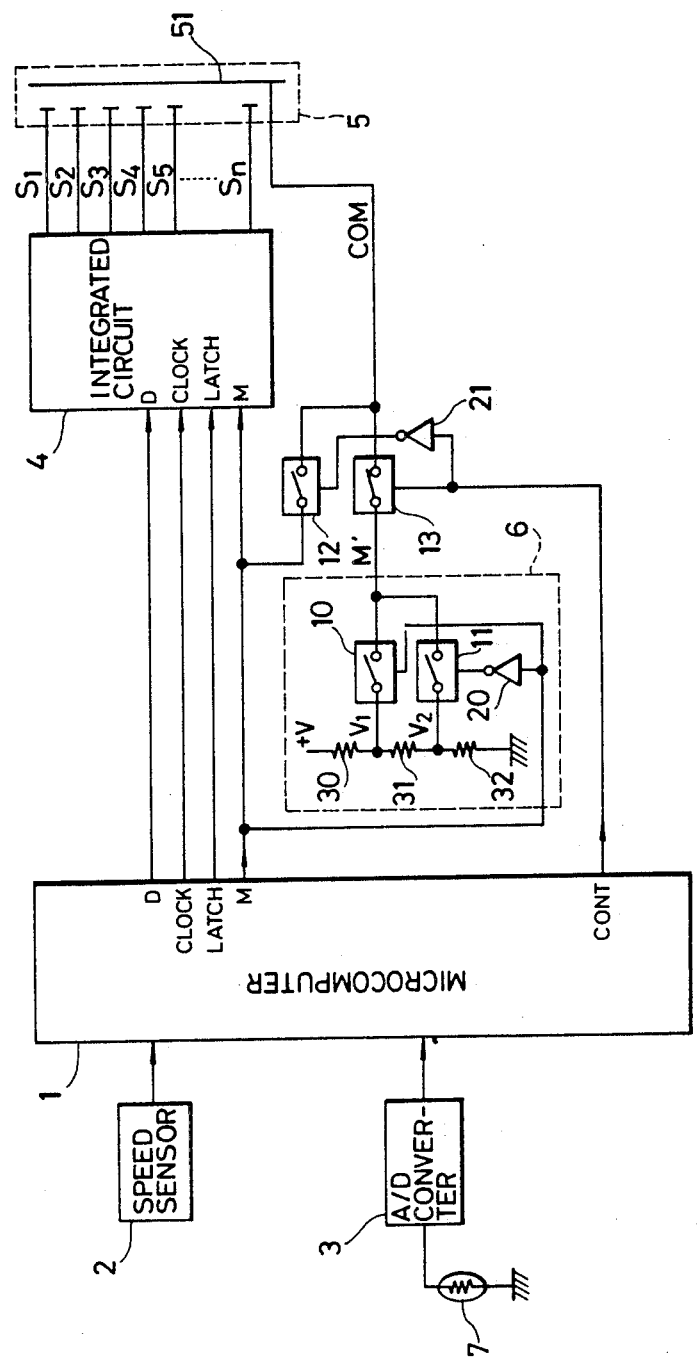
FIG. 1 is a circuit diagram of a driving circuit for liquid crystal display according to one embodiment of the present invention.

FIG. 1 shows one embodiment of the present invention applied to the display of a speed meter of a car. In FIG. 1, reference numeral 1 denotes a microcomputer, 2 denotes a car's speed sensor, 3 denotes an A/D converter, 4 denotes an I.C. specially made for the driving circuit for liquid crystal display, 5 denotes a liquid cristal display element, 6 denotes a voltage generator, 7 denotes a thermister, 10 to 13 denote analog switches, 20 and 21 denote inverters and 30 to 32 denote resistors. The microcomputer 1 receives a pulse signal from the speed sensor of a car and gives not only the speed data D but also the signals CLOCK, LATCH, M, CONT etc. as outputs. Furthermore, this microcomputer has a function of varying the duty ratio of the signal CONT according to the received signal from thermister 7 arranged in the neighborhood of the liquid crystal display element 5 through the A/D converter 3.

An I.C. such as HD49100 for driving the liquid crystal display is used as the I.C.4. This I.C. contains a shift register and latch circuits and is able to control the liquid crystal display element 5 composed of n display segments. The data D is shifted n times by the edge part of the CLOCK signal and latched by the LATCH signal. Furthermore, according to this latched data, each segment $S_1$, $S_2$, $S_3$, ... or $S_n$ is supplied with a square wave which is in inverse phase with the signal M when a corresponding segment is required to turn ON and contrary in same phase with the signal M to turn OFF.

The liquid crystal display element 5 is composed of n display segments and indicates the speed as one of n steps divided equally from zero to the maximum speed.

The voltage generator 6 generates as a signal M' alternatively voltages $V_1$ and $V_2$ into which voltage V is divided by resistors 30, 31 and 32 through the analog switches 10 and 11 operated by the signal M which is 50% duty square wave. While the signal M itself is given to the analog switch 10 as an input, the signal M inverted by the inverter 20 is given to the analog switch 11, and the analog switch 11 is opened when the analog switch 10 is closed and vice versa. Consequently, the signal M' equals to $V_1$ when the signal M is in high level and to $V_2$ when the signal M is in low level.

The analog switches 12 and 13 operate according to the signal CONT generated by the microcomputer 1 and deliver the signal M as the input signal COM to the common electrode 51 of the liquid crystal display element 5 when the signal CONT is in low level and deliver the signal M' as the signal COM when the signal CONT is in high level.

In the following, this embodiment is explained with reference to the waveforms illustrated in FIGS. 2A to 2G.

As is well known, in the case of systems which display or indicate results obtained by digital processing of signals, it is common to construct the system such that the contents of display are renewed at a predetermined constant cycle. In this embodiment, this cycle time is 0.5 second.

Figure 2:
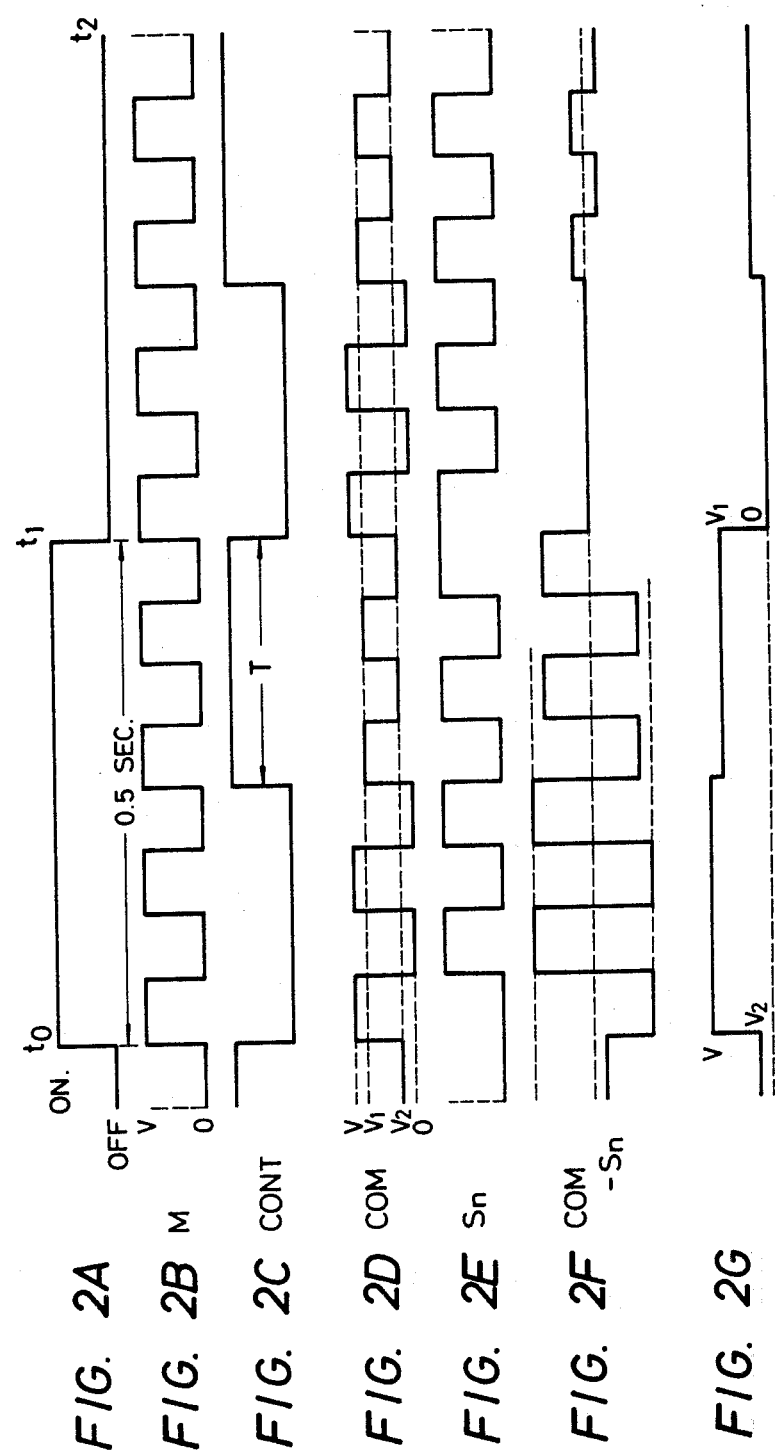
FIGS. 2A, 2B, 2C, 2D, 2E, 2F and 2G show the waveform for illustrating the operation of the embodiment shown in FIG. 1.

Now, FIG. 2A shows the state of the display on the segment $S_n$ in the case that the display of any segment of the liquid crystal display element 5, for example $S_n$, turns to ON from OFF at the time $t_0$ and after that it turns to OFF from ON at the time $t_1$. It is evident as above mentioned that the interval between $t_0$ to $t_1$ (the display renewal period) is 0.5 second.

As is shown in FIG. 2B, the signal M is a square wave of 50% duty factor and its repetition period is an even number of 0.5 second. Moreover its timing of the rising edge coincides with the timing of the display renewal shown in FIG. 2A accurately, and its high and low levels are the voltage V and zero volt, respectively.

The signal CONT is a square wave having a repetition period coincident with the period of the display renewal and the voltage falls down to low level at every time of the display renewal $t_0, t_1$ and the duration T of the followed high level voltage may be varied according to the temperature of the liquid crystal element 5 such that the lower the temperature is, the longer the duration T is.

The signal COM may be the signal shown in FIG. 2D because, as mentioned above, the signal COM is the signal M when the signal CONT is in low level and is the signal M' when the signal CONT is in high level.

The signal supplied to the segment $S_n$ is in inverse phase with the signal M in the interval between $t_0$ to $t_1$, and is in same phase with the signal M in the other interval as shown in FIG. 2E when the segment $S_n$ is controlled as shown in FIG. 2A because, as described already, the I.C. 4 controls the signal supplied to each segment $S_1$-$S_n$ of the display element 5 to be in same phase with the signal M when a corresponding segment is maintained to turn OFF and to be in inverse phase with the signal M when a segment is maintained to turn ON.

As a result of the above, in the embodiment shown in FIG. 1, the voltage supplied between the segment $S_n$ and the common electrode 51 of the liquid crystal display element 5 is the differential voltage between the voltage of the signal COM shown in FIG. 2D and the signal $S_n$ shown in FIG. 2E, that is COM-$S_n$. Hence the wave of this signal is a square wave shown in FIG. 2F and the effective value of the voltage is shown in FIG. 2G.

Therefore, in the embodiment of FIG. 1, when a segment of the liquid crystal display element 5 is turned to ON from OFF at the time $t_0$, the voltage supplied to the segment rises from the voltage $V_2$ biased beforehand to the proper comparative high voltage V and then falls down to zero volt from the voltage $V_1$, which is lower than the voltage V, when the segment is turned to OFF from ON at the time $t_1$.

Now the general response characteristics of such a liquid crystal display element 5 are shown in figures from FIG. 3 to FIG. 6. According to FIG. 3, the rise time from OFF to ON is shorter as the driving voltage V is higher and according to FIG. 4, in the case of giving bias voltage, it is also shorter as the given bias voltage is higher. The fall time from ON to OFF is shorter as the driving voltage is lower and also shorter when no bias voltage is given.

Figure 3:
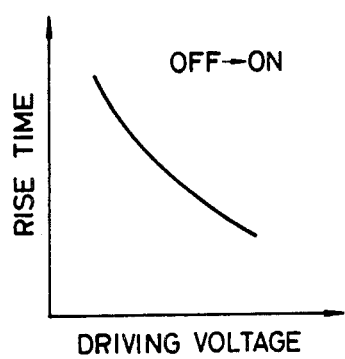
FIG. 3, FIG. 4, FIG. 5 and FIG. 6 show characteristic curves respectively illustrating the response speed of the liquid crystal display element.
Figure 4:
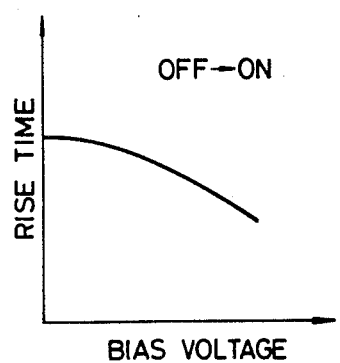
Figure 5:
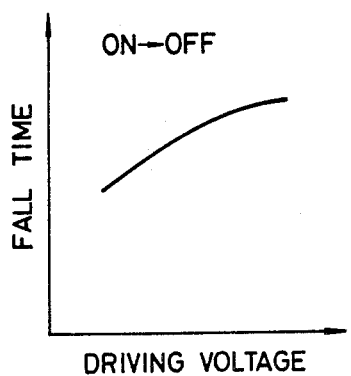
Figure 6:
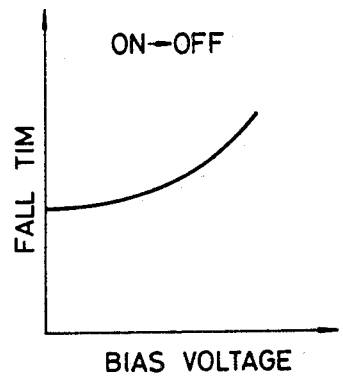

Hence, in the embodiment shown in FIG. 1, as is evident from FIGS. 2F and 2G, the condition for shortening the rise time shown in FIG. 3 and FIG. 4 are both satisfied because the driving voltage for the segment varies to comparative high voltage that is maximum voltage V from the biased voltage $V_2$ when the segment turns to ON from OFF at the time such as $t_0$. Accordingly sufficient fast rise response of the liquid crystal display element 5 is accomplished. And also the condition for shortening the fall time shown in FIG. 5 and FIG. 6 are both satisfied because the driving voltage for the segment is changed to unbiased zero volt from the comparative low voltage $V_1$ when the segment is turned to OFF from ON at the time such as $t_1$, hence the response characteristics of sufficient fast fall time of the liquid crystal display element 5 can be accomplished. As the result, the sufficient fast response characteristics can be attained in spite of using the I.C. 4 commonly used for driver.

In the case of the embodiment shown in FIG. 1, the thermister 7 is provided and the duration T of high level of the signal CONT is controlled according to the temperature of the liquid crystal display element 5 as shown in FIG. 2C. Consequently, as is evident from FIGS. 2D, 2F and 2G, the duration during which the ON state driving voltage for the liquid crystal display element 5 is maintained to voltage $V_1$, which is lower than V, is varied according to the temperature of the liquid crystal display element 5 and the duration maintained to $V_1$ is longer as the temperature is lower.

On the other hand, the response characteristics of such the liquid crystal display element 5 is influenced by the duration in which the driving voltage during ON is reduced previously, and the fall time becomes shorter if this duration is properly long.

Consequently, in the case of the above embodiment, the response characteristics of the liquid crystal display element 5 becoming worse under lower temperature can be compensated automatically, and the operation with nearly constant response speed can be accomplished even under the condition of fluctuation in temperature.

Although, in the case of the above embodiment, nearly constant response characteristics is attained by controlling the high level duration T of the signal CONT, it can also be attained by changing the voltages $V_1$ and $V_2$ according to the temperature. Namely, by using thermisters instead of the resistors 30 and 31 or connecting thermisters in parallel with resistors 30 and 31 respectively in the voltage generator 6 shown in FIG. 1, it is possible to reduce the voltage $V_1$ and also possible to increase the voltage $V_2$ as the temperature goes down.

By this way, it is also possible to compensate the variation of the response characteristics of the liquid crystal display element 5 due to the fluctuation of the temperature and to attain constant display characteristics.

As mentioned above, according to the present invention, by only changing the driving voltage for the common electrode of the liquid crystal display element, an improvement of response characteristics is attained and it is possible to overcome the disadvantage of the conventional method and improve the response characteristics using the commonly used integrated circuit for driving the liquid crystal and as the result it is possible to present a low cost and high performance driving circuit for the liquid crystal display.

I claim:

1. A driving circuit for a liquid crystal display element which has segment electrodes and a common electrode and is required to renew the indication cyclically with a predetermined period; comprising:

first means for generating a first driving wave which has a periodic alternation of maximum and minimum voltages with a predetermined repetition period;

second means for generating a second driving wave which has a periodic alternation of maximum and minimum voltages with the same repetition period as the first driving wave, the maximum voltage of the second driving wave being lower than that of the driving wave and the minimum voltage of the second driving wave being higher than that of the first driving wave; and third means for applying the first driving wave to the common electrode during the initial stage of the indication renewal period and applying the second driving wave to the common electrode during the remaining stage of the indication renewal period.

2. A driving curcuit according to claim 1, wherein a ratio of the interval during which the second driving wave is applied to the common electrode to the interval during which the first driving wave is applied to the common electrode is varied in accordance with a temperature of the liquid crystal display element.

3. A driving circuit according to claim 1, wherein a ratio of the maximum voltage of the second driving wave to the maximum voltage of the first driving wave is varied in accordance with a temperature of the liquid crystal display element.

4. A driving circuit for a liquid crystal display element which has segment electrodes and a common electrode and is required to renew the indication cyclically with a predetermined period; comprising:

a first generator for generating a first square wave having a repetition period equal to an even number of the indication renewal period;

a second generator for generating a second square wave a high lvel of which is lower than that of the first square wave, a low level of which is higher than that of the first square wave, and which has the same repetition period as the first square wave; and means for applying the first square wave to the common electrode during the initial stage of the indication renewal period and applying the second square wave to the common electrode during the remaining stage of the indication renewal period.

5. A driving circuit according to claim 4, wherein a ratio of the interval during which the second square wave is applied to the common electrode to the interval during which the first square wave is applied to the common electrode is varied in accordance with a temperature of the liquid crystal display element.

6. A driving circuit according to claim 4, wherein a ratio of a value of the high level in the second square wave to a value of the high level in the first square wave is varied in accordance with a temperature of the liquid crystal display element.

* * * * *